United States Patent [19]
Misawa et al.

[11] 3,745,428
[45] July 10, 1973

[54] SEMICONDUCTOR DEVICE HAVING A COMPOSITE FILM AS A PASSIVATING FILM

[75] Inventors: Yutaka Misawa; Takuzo Ogawa; Hideyuki Yagi, all of Hitachi-shi, Japan

[73] Assignee: Hitachi, Ltd., Tokyo, Japan

[22] Filed: Feb. 1, 1971

[21] Appl. No.: 111,267

[30] Foreign Application Priority Data

Jan. 30, 1970 Japan .................................. 45/7715

[52] U.S. Cl. .............................. 317/235 R, 317/235
[51] Int. Cl. ................................................ H01l 7/00
[58] Field of Search ....................................... 317/275

[56] References Cited

UNITED STATES PATENTS

| | | | |
|---|---|---|---|
| 3,343,049 | 9/1967 | Miller et al. | 317/235 |
| 3,507,716 | 4/1970 | Nishida et al. | 317/235 |
| 3,462,657 | 8/1969 | Brown | 317/235 |
| 3,560,810 | 2/1971 | Balk et al. | 317/235 |
| 3,566,517 | 3/1971 | Brown et al. | 317/235 |
| 3,575,743 | 4/1971 | Chiovarou et al. | 317/235 |

*Primary Examiner*—Jerry D. Craig
*Attorney*—Craig and Antonelli

[57] ABSTRACT

A semiconductor device having a composite film as a passivating film formed on the surface of the device in the order of films of silicon oxide formed by thermal oxidation, phosphorous glass, silicon oxide formed by chemical vapor deposition and silicon nitride, whereby cracks, which occurs in the film when the phosphorous glass film is in contact with the silicon nitride film, can be eliminated.

3 Claims, 11 Drawing Figures

INVENTORS
YUTAKA MISAWA, TAKUZO OGAWA
AND HIDEYUKI YAGI
BY
Craig, Antonelli,
Stewart & Hill
ATTORNEYS INVENTORS
YUTAKA MISAWA, TAKUZO OGAWA
AND HIDEYUKI YAGI
BY
Craig, Antonelli, Stewart & Hill
ATTORNEYS INVENTORS
YUTAKA MISAWA, TAKUZO OGAWA
AND HIDEYUKI YAGI
BY Craig, Antonelli, Stewart & Hill
ATTORNEYS INVENTORS
YUTAKA MISAWA, TAKUZO OGAWA
AND HIDEYUKI YAGI
BY
Craig, Antonelli,
Stewart & Hill
ATTORNEYS INVENTORS
YUTAKA MISAWA, TAKUZO OGAWA
AND HIDEYUKI YAGI
BY
Craig, Antonelli,
Stewart & Hill
ATTORNEYS

SEMICONDUCTOR DEVICE HAVING A COMPOSITE FILM AS A PASSIVATING FILM

The present invention relates to an improved technique for passivating a semiconductor device, and more particularly to a semiconductor device having a composite film free from cracks occurring therein.

A great number of techniques for passivating semiconductor devices have been suggested heretofore in order to protect the devices from undesirable irreversible changes of electric parameters thereof. Since the surface of the semiconductor device is active and tends to be influenced by environment, it must be protected by a suitable passivating film.

The kind of film to be employed is chosen from the view point of the passivating effect thereof. In a type of a semiconductor device in which at least one edge of a PN junction extends to a plane surface of the semiconductor body, the free surface including the surface of the edge is covered with a silicon dioxide film which is formed by thermal oxidation on the surface of the body. The silicon dioxide film thus formed will be referred to hereinafter as $SiO_2$ (T.O.) film. The $SiO_2$ (T.O.) film has been used not only as a passivating film but also as a masking film for doping impurity into the body. The $SiO_2$(T.O.) film has been recognized as one of the most suitable passivating films because it produces only small surface effects on the PN junction. Especially, it generates only a small charge density $N_{FB}$ in the surface of the body. From the above-mentioned points of view, the $SiO_2$ (T.O.) film has been used widely as a passivating film.

In practice, however, the $SiO_2$ (T.O.) film should be covered with a phosphorous glass comprising a glassy mixture of phosphorus pentoxide $P_2O_5$ and silicon dioxide $SiO_2$, since the $SiO_2$ (T.O.) film has a considerably poor alkali-ion resistance. In other words, alkali substances, such as, sodium ions, lithium ions or the like, which tend to be drawn into the $SiO_2$ (T.O.) film during the processes of impurity doping, chemical etching, electrode bodning, etc., can move into and in such film to undesirably change the electric parameters of the device.

In order to eliminate or reduce the effect of the alkali ions, the phosphorus glass film (hereinafter referred to as $P_2O_5$-$SiO_2$ glass film) is formed in superposed relation on the $SiO_2$ (T.O.) film, whereby the alkali ions are trapped by the $P_2O_5$-$SiO_2$ glass. In a process for producing the $P_2O_5$-$SiO_2$ glass film, a sample consisting of a silicon substrate and the $SiO_2$ (T.O.) film is placed into a gaseous atmosphere containing phosphorous oxychloride $POCl_3$, nitrogen and oxygen gases kept at a temperature at which the $POCl_3$ decomposes to deposit as a compound $P_2O_5$ on the $SiO_2$ (T.O.) film. The deposited $P_2O_5$ and $SiO_2$ (T.O.) are heated to mutually diffuse, whereby a glassy mixture is formed having a thickness and a $P_2O_5$ concentration which are determined in accordance with the heating temperature and heating time.

Such dual films are necessary for passivating the device, provided that the inclusion of the alkali ions can not completely be avoided. However, it is impossible to completely remove the alkali ions from a practical point of view.

Although the undesirable influence of alkali ions can be avoided by employing the above mentioned dual film,it is a severe drawback that the $P_2O_5$-$SiO_2$ glass film is very poor in moisture resistance.

Therefore, it is required to protect the dual film from the moisture by means of another film of good moisture resistance. In order to solve the above problem, there have been provided semiconductor devices having a film with three layers or a triple film. A silicon nitride film (hereinafter referred to as $Si_3N_4$ film) is one of typical films with good moisture resistance. Since the $Si_3N_4$ film has not only a good resistance to moisture, but also a considerably excellent resistance to alkali ions, this is a very suitable material as a passivating film.

According to a process for producing the $Si_3N_4$ film, a silicon substrate is placed into a gaseous atmosphere containing monosilane $SiH_4$ and ammonia $NH_3$ kept at a temperature at which the compounds react to form silicon nitride $Si_3N_4$ as a deposit.

After many attempts in employing the $Si_3N_4$ film superposed on the dual film mentioned above, it has been experienced that cracks occur almost every time in the $Si_3N_4$ film or in the three-layer film. Although the inventors have not yet ascertained fully what cause generates the cracks, the results of the inventors' experiments indicate that one of these causes may be a big difference in thermal expansion coefficients between the $Si_3N_4$ and $P_2O_5$-$SiO_2$ glass films, and that another may be a chemical reaction which takes place between the $Si_3N_4$ and $P_2O_5$. The inventors have made many attempts with respect to choice of film thickness, film-forming condition, heat-treatment or aging for the film and so on in order to solve the above problem; however, these attempts did not succeed.

Although it may be possible to slightly reduce the tendency of crack occurrence by reducing the thickness of the $Si_3N_4$ film, a number of pin-holes are then left in the film thereby deteriorating the moisture resistance and resistance to chemicals. As a result, the semiconductor device tends to become influenced by environmental conditions. Therefore, there exists a minimum thickness of the $Si_3N_4$ film required for attaining the desired passivating effect. The inventors have concluded in accordance with the results of their experiments that the minimum thickness of the $Si_3N_4$ film must be at least 800 angstroms, especially 1,000 angstroms. In case of such an $Si_3N_4$ film, however, the inventors' experiments have proved that the crack occurrence of the $Si_3N_4$ film formed by conventional methods can scarcely be avoided. This may be a reason why the $Si_3N_4$ film has not been used as a passivating film on an industrial scale.

Accordingly, it is an object of the present invention to provide a semiconductor device having an improved composite passivating film.

It is another object of the present invention to provide a semiconductor device having a four-layer or quadruple passivating film, each layer being arranged and superposed in such order that no crack occurs in the film, whereby semiconductor devices excellent in moisture resistance can be produced with a high yield rate.

According to the present invention there is provided a semiconductor device having such a four-layer passivating film which comprises a first silicon dioxide film formed by thermal oxidation on the surface of a silicon body, a phosphorous glass film superposed on the first silicon dioxide film, a second silicon dioxide film formed by chemical vapor deposition on the phosphorous glass film, and a silicon nitride film formed on the second silicon dioxide film.

The above objects and other objects and features of the present invention will be apparent from the following detailed description, taken in conjunction with the attached drawings in which.

According to the experiments conducted by the inventors of the present invention, it has been found that an $Si_3N_4$ film should have at least about 1,000 angstroms in thickness in order for sufficiently reducing the pin-holes. This can be understood from the facts shown in FIG. 1, in which the $Si_3N_4$ film was formed under the most proper and favorable condition, i.e., in which the flow rate of ammonia gas $NH_3$ to monosilane $SiH_4$ is 25 by volume and the temperature for depositing $Si_3N_4$ is 830° C. Although the pin-holes present in the $Si_3N_4$ film can be reduced by changing the forming condition, other disadvantages may take place by such a change. Therefore, the minimum thickness of the $Si_3N_4$ film is about 1,000 angstroms, in the present invention. The upper limit of thickness of the $Si_3N_4$ film will be explained later on in accordance with other information derived from the present invention.

As stated already, in the semiconductor devices having a composite passivating film of the $Si_3N_4$ and $P_2O_5$-$SiO_2$ glass films, it was almost impossible to avoid the crack occurrence. In order to analyze the cause of crack occurrence, the inventors investigated the thermal expansion coefficients with respect to silicon, $P_2O_5$-$SiO_2$ glass, $SiO_2$ (T.O.), $SiO_2$ (CVD) and $Si_3N_4$. Since the thermal expansion coefficients of $P_2O_5$-$SiO_2$ glass and $SiO_2$ (CVD) films could not be determined clearly, they were estimated in accordance with the degrees of the radius of curvature, i.e., the degrees of bend of the samples; namely, one of which comprises a silicon body of 50 microns in thickness and a $P_2O_5$-$SiO_2$ glass film of 1,500 angstroms in thickness, and another comprises the same substrate as mentioned above and an $SiO_2$ (CVD) film of 1,000 angstroms in thickness. The silicon body and the film materials are arranged in accordance with the thermal expansion coefficients thereof as follows:

$SiO_2$ (T.O.) < $P_2O_5$-$SiO_2$ glass < Si < $SiO_2$ (CVD) < $Si_3N_4$

The thermal expansion coefficients of the above materials are shown in the following Table 1:

TABLE 1

| Material | thermal expansion coefficient |
|---|---|
| $SiO_2$(T.O.) | $4.0 \times 10^{-7}$/°C |
| $P_2O_5$–$SiO_2$ glass | of the order of $10^{-7}$/°C |
| $SiO_2$ (CVD) | of the order of $10^{-6}$/°C |
| $Si_3N_4$ | $3.85 \times 10^{-6}$/°C |
| Si | $3.74 \times 10^{-6}$/°C |

It will be appreciated from the above facts that a big difference in thermal expansion coefficients exists between the $P_2O_5$-$SiO_2$ glass and $Si_3N_4$ films and that such big difference will cause the cracks in the films.

Figures 1, 2:
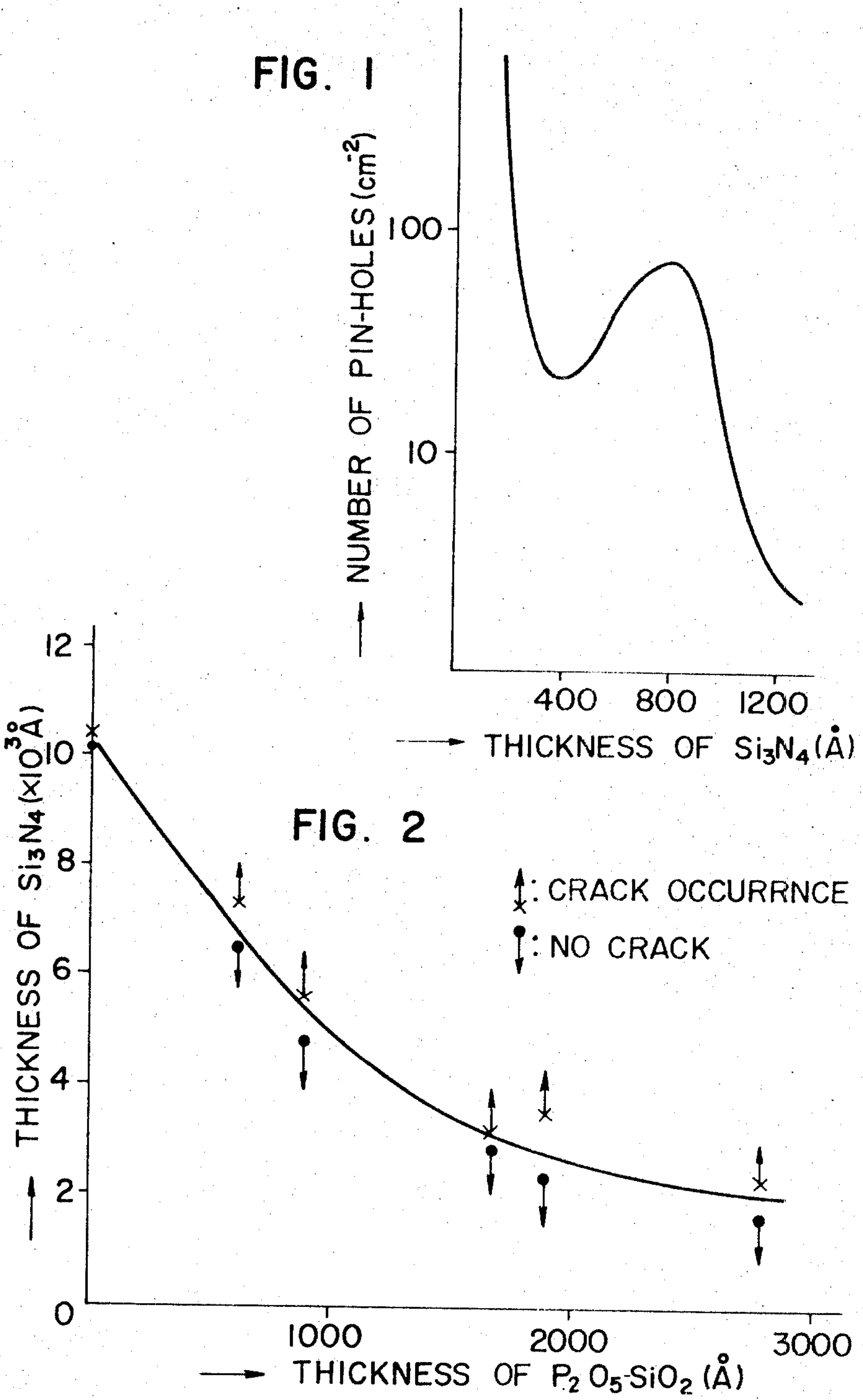
FIG. 1 is a graph showing the number of pin-holes in an $Si_3N_4$ film.
FIG. 2 is a graph showing a curve of thickness limit with respect to crack occurrence in $P_2O_5$-$SiO_2$ glass and $Si_3N_4$ film.

According to FIG. 2 which shows a curve of limit in thickness with respect to crack occurrence, it will be appreciated that an increase in the thickness of $P_2O_5$-$SiO_2$ glass film has a tendency to increase crack occurrence in the $Si_3N_4$ film. As stated already, the minimum thickness of $Si_3N_4$ film is about 1,000 angstroms. From this point of view (pin-holes), the larger the thickness of the $Si_3N_4$ film, the more proper the film will become; however, as understood from the results shown in FIG. 2, there exists an upper limit of the thickness of $Si_3N_4$ film. In connection with this matter, the inventors concluded a thickness of $Si_3N_4$ of about 1,000 to about 3,000 angstroms is proper.

On the other hand, the thickness of $P_2O_5$-$SiO_2$ glass film necessarily has to be limited within a particular range from the view point of the alkali trapping effect and soundness thereof.

The inventors believe that the $P_2O_5$-$SiO_2$ film should have at least about 500 angstroms in thickness in order to expect a sufficient alkali trapping effect. Since the $P_2O_5$-$SiO_2$ film is formed by the mutual diffusion of $P_2O_5$ and $SiO_2$ which is carried out by heating, and since the thickness of the $P_2O_5$-$SiO_2$ glass film is determined in accordance with the temperature and the time of heating same, the dimensional change of a predetermined PN junction takes place when the body is excessively heated. Accordingly, the maximum thickness of $P_2O_5$-$SiO_2$ glass film is about 2,000 angstroms when superposed with the $Si_3N_4$ film.

Figure 3:
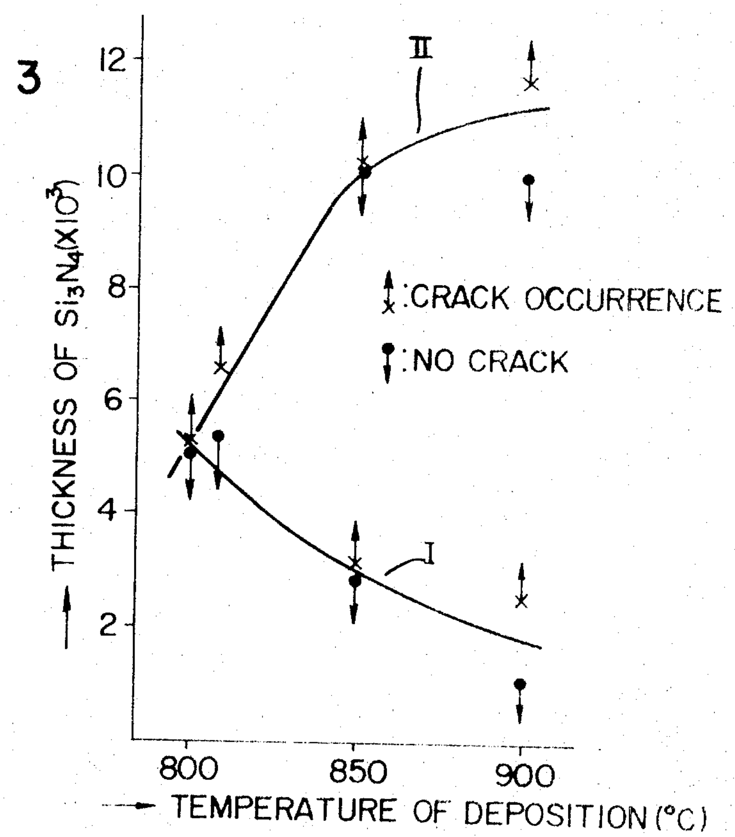
FIG. 3 is a graph showing relationships between thickness limit with respect to crack occurrence and the temperature at which $Si_3N_4$ is deposited on an $SiO_2$ film formed by thermal oxidation.

It has been found that the crack occurrence is not necessarily caused only by the difference in the thermal expansion coefficients between the $Si_3N_4$ and $P_2O_5$-$SiO_2$ glass films. This will be understood from the results shown in FIG. 3. A curve I illustrates in this figure the limit in thickness concerning samples provided with an $SiO_2$ (T.O.) film of 7,000 angstroms and a $P_2O_5$-$SiO_2$ film of 1,400 angstroms in thickness, and the curve II the limit in thickness concerning samples provided with an $SiO_2$ (T.O.) film of 7,920 angstroms in thickness. All the $Si_3N_4$ films were formed in accordance with the condition of a $SiH_4$ flow amount of 5 cc/min., $NH_3/SiH_4$ is 30 by volume and a nitrogen flow amount of 10 l/min. According to FIG. 3, it will be understood that the formation of the $P_2O_5$-$SiO_2$ film between the $Si_3N_4$ film and the $SiO_2$ (T.O.) film will lower the thickness limit of the $Si_3N_4$ film as shown by the curve I. From the fact that an increase in temperature for depositing $Si_3N_4$ lowers the thickness limit, the crack occurrence may be caused by another cause. In connection therewith, the inventors have therefore thought the crack may also be caused by a chemical reaction which takes place between the $Si_3N_4$ and $P_2O_5$-$SiO_2$ glass films and that this disadvantage will be avoided by inserting a kind of filtering film between the above two films.

Figure 4:
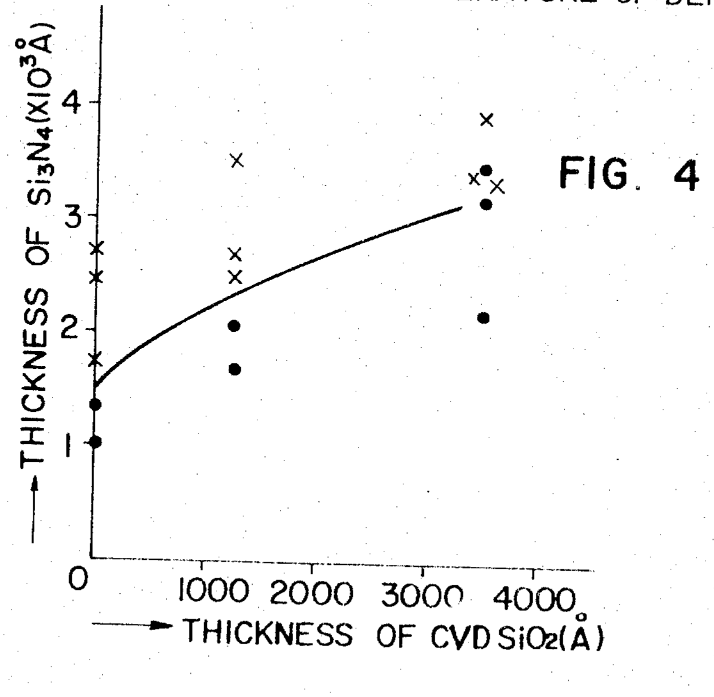
FIG. 4 is a graph showing thickness limit with respect to the crack occurrence in an $SiO_2$ film formed by chemical vapor deposition and an $Si_3N_4$ film.

After the inventors' investigations, it has been found that a silicon dioxide film formed by chemical vapor deposition, i.e., an $SiO_2$(CVD) film, is suitable as a film to be inserted between the $Si_3N_4$ and $P_2O_5$-$SiO_2$ films. The $SiO_2$ (CVD) film has a thermal expansion coefficient adjacent to those of the $Si_3N_4$ and $P_2O_5$-$SiO_2$ films. Furthermore, this film has no reactivity with respect to $Si_3N_4$. By the formation of the $SiO_2$ (CVD) film between the above two films, the crack occurrence will be avoided effectively. It goes without saying that the $SiO_2$ (CVD) film should have a proper thickness in order to attain its effect. According to applicants' investigations, it was found an $SiO_2$ (CVD) film of about 1,000 to about 6,000 angstroms in thickness is proper. When the $SiO_2$ (CVD) film has a thickness smaller than 1,000 angstroms, the cracks in the $Si_3N_4$ films can not be prevented sufficiently. In the case where the film is thicker than 6,000 angstroms, it takes too long a time to form such a thick $SiO_2$ (CVD) film and the cracks tend to occur in accordance with the big difference in thermal expansion coefficients between the $SiO_2$ (CVD) film and the $Si_3N_4$ film. The reasons for the thickness of the $SiO_2$ (CVD) film will be understood from the results shown in FIG. 4 which shows the limit in thickness with respect to the crack occurrence between the $SiO_2$ (CVD) film and the $Si_3N_4$ film. From the results will be appreciated that with an increase in the thickness of $SiO_2$ (CVD) film the tendency of crack occurrence will become small. In the experiments, an $SiO_2$ (T.O.) film of 6,200 angstroms and a $P_2O_5$-$SiO_2$ glass (12 mol percent of $P_2O_5$) film of 1,550 angstroms in thickness were previously formed under the $SiO_2$ (CVD) film.

The investigations have also proved that the cracks occurring in the films are generated by the difference in the Young's modulus between the film materials under consideration. The film materials and silicon body are arranged in accordance with the magnitudes of Young's modulus as follows:

$SiO_2$ (CVD) < $P_2O_5$-$SiO_2$ glass < $SiO_2$(T.O.) < Si < $Si_3N_4$

The Young's moduli in concrete value are shown in Table 2.

TABLE 2

| Material | Young's modulus |
|---|---|
| $SiO_2$(T.O.) | 4 to 7 × $10^8$ g/cm² |
| $P_2O_5$–$SiO_2$ glass | of the order of $10^8$ g/cm² |
| $SiO_2$ (CVD) | of the order of $10^8$ g/cm² |
| $Si_3N_4$ | 4.0 × $10^{10}$ g/cm² |
| Si | 1.7 × $10^9$ g/cm² |

Figure 5:
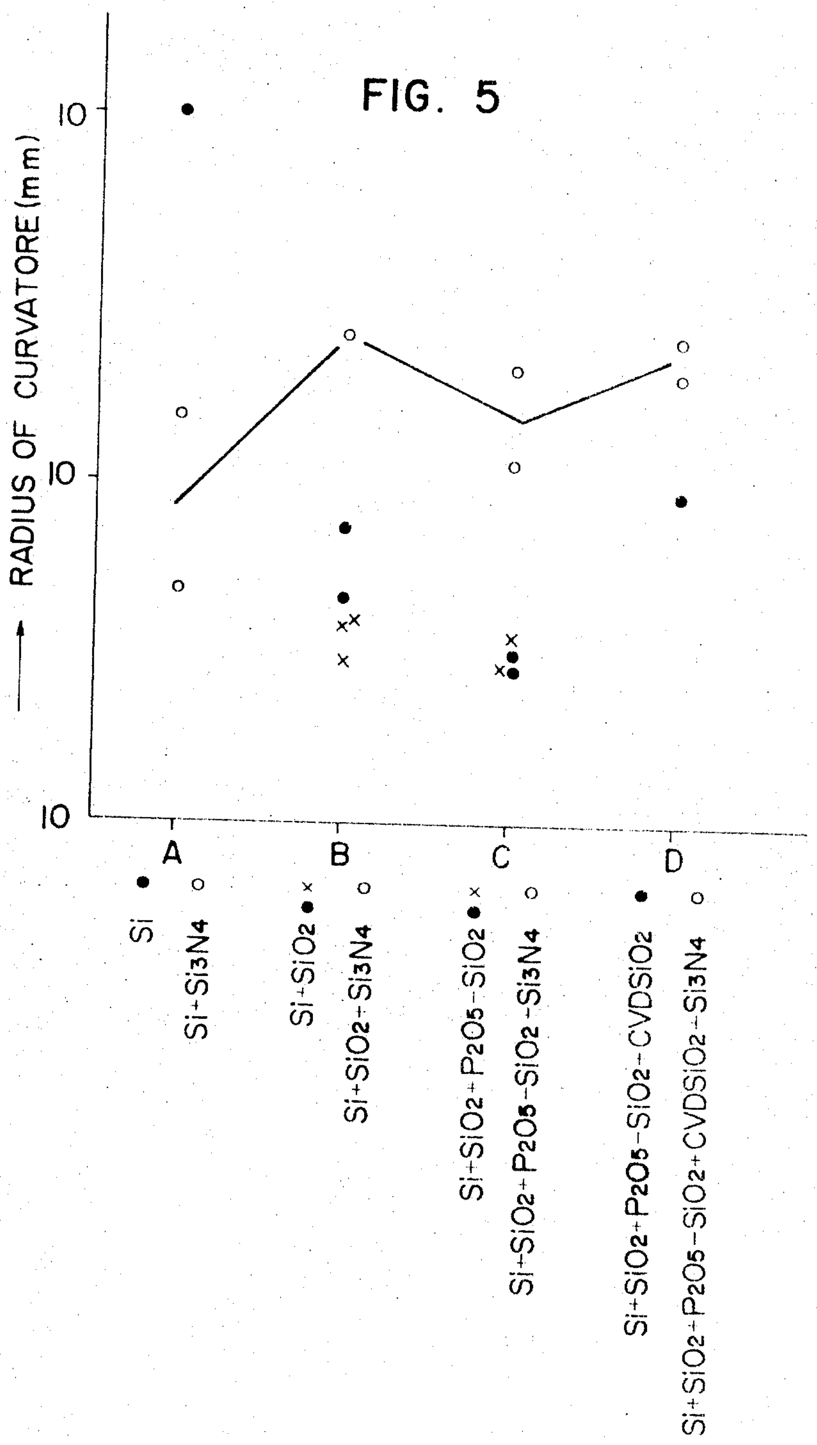
FIG. 5 shows the radius of curvature of semiconductor bodies having various passivating films and that of a silicon body as a comparison.

The present inventors undertook tests of which the results are shown in FIG. 5. In FIG. 5, the ordinate represents the radius of curvature in millimeters, and the abscissa the kinds of samples. In samples designated by A, (●) represents the radius of curvature of silicon and (◎) represents that of the sample comprising a silicon substrate and an $Si_3N_4$ film of 3,940 angstroms in thickness. Similarly, in samples B, (●) represents samples comprising a silicon substrate and an $SiO_2$(T.O.) film of 7,450 angstroms, (x) samples comprising a silicon substrate and an $SiO_2$ (T.O.) film of 7,300 angstroms, and (◎) a sample comprising a silicon substrate, an $SiO_2$ (T.O.) film of 7450 angstroms and an $Si_3N_4$ film of 3,900 angstroms; in samples C, (●) represents samples comprising a silicon substrate, an $SiO_2$ (T.O.) film of 5,810 angstroms and a $P_2O_5$-$SiO_2$ glass film of 1,700 angstroms, (x) samples comprising a silicon substrate, an $SiO_2$ (T.O.) film of 5,450 angstroms and a $P_2O_5$-$SiO_2$ glass film of 1,510 angstroms, and (◎) samples comprising a silicon substrate and an $Si_3N_4$ film superposed on the $P_2O_5$-$SiO_2$ glass film of 5,810 angstroms; and in samples D, (●) represents a sample comprising a silicon substrate and an $SiO_2$(CVD) film of 5,240 angstroms superposed on the $P_2O_5$-$SiO_2$ glass film used as (●) samples in C, and (◎) samples comprising a silicon substrate and an $Si_3N_4$ film of 3,900 angstroms superposed on the above $SiO_2$ (CVD) film. In this experiment, all the samples designated by (◎), which have the $Si_3N_4$ film, bend toward the direction opposite to that of samples designated by (●) and (x).

Since the $SiO_2$ (T.O.) and $P_2O_5$-$SiO_2$ glass films have thermal expansion coefficients smaller than that of silicon, samples provided with these films bend toward the side of films unformed. In the case that an $Si_3N_4$ film which has a thermal expansion coefficeint larger than that of silicon and has the largest Young's modulus in the materials under discussion, is formed, however, the samples bend toward the side of films formed and the radius of curvature becomes larger as compared with the case of no $Si_3N_4$ film, i.e., by the formation of the $Si_3N_4$ film the degree of bend is made small.

It is a remarkable and unexpected effect for the purpose of preventing the crack occurrence, that in combining the $SiO_2$ (CVD) film with the $Si_3N_4$ film, the radius of curvature becomes smaller than in the case of no $SiO_2$ (CVD) film.

From the various points of view mentioned above, it will be understood that the $SiO_2$ (CVD) film is most proper for attaining the objects of the present invention.

Figure 6:
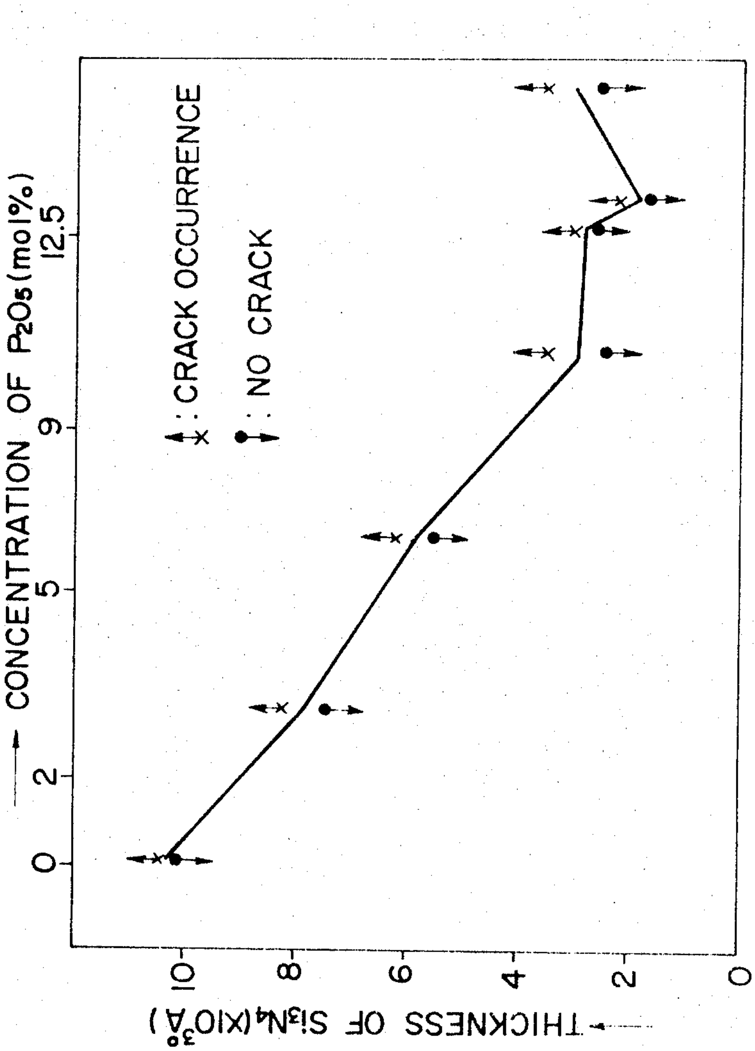
FIG. 6 is a graph showing the relationship between the concentration of $P_2O_5$ in a $P_2O_5$-$SiO_2$ glass film and the thickness limit with respect to crack occurrence in an $Si_3N_4$ film, and FIGS. 7*a* through 7*e* explain a process for manufacturing a semiconductor device according to the present invention.

The present inventors have discovered that the tendency of crack occurrence can be lowered by reducing the concentration of $P_2O_5$ in the $P_2O_5$-$SiO_2$ glass film as is understood from the results shown in FIG. 6. In general, from the practical point of view, the $P_2O_5$ concentration employed is about 12 to 13 mol percent; however, by lowering the $P_2O_5$ in the $P_2O_5$-$SiO_2$ glass film to about 9 mol percent, the tendency of the crack occurrence can be reduced remarkably. Since the $P_2O_5$ concentration is determined by the heating temperature for mutually diffusing $P_2O_5$ and $SiO_2$, the lowest $P_2O_5$ concentration is necessarily determined by the need to avoid the dimensional change of PN junction in the device. In connection therewith, the inventors therefore propose such a $P_2O_5$ concentration as is in the range of about 5 to about 9 mol percent.

FIGS. 7*a* through 7*e* explain one of the processes for manufacturing the semiconductor device according to the present invention. In this example, the process showing a particular technique with respect to forming the passivating films is employed for the purpose of preventing the crack occurrence. According to the investigation, the cracks arise in the parts where the concentric stress tends to occur, particular in edges of holes or grooves of the films. In order to solve this problem, the process shown in FIGS. 7*a* through 7*e* is employed in such a manner that the $Si_3N_4$ film is so formed as to avoid the crack occurrence.

Figure 7A:
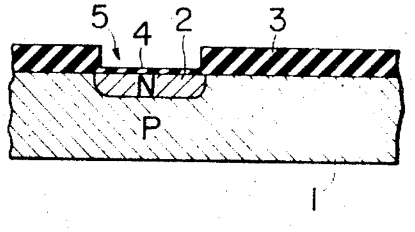
Figure 7B:
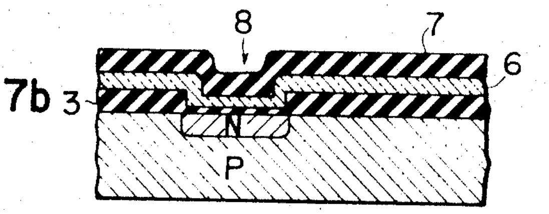

First, a silicon wafer having a PN junction formed between a p-type region 1 and an n-type region 2 is prepared. The n-type region 2 is formed by doping an n-type impurity through an opening 5 which is formed in an $SiO_2$ (T.O.) film 3. During the impurity doping, a thin $SiO_2$ (T.O.) film 4 is also formed on the surface exposed at the opening as shown in FIG. 7*a*.

After the desired PN junction is formed, a $P_2O_5$-$SiO_2$ film 6 is formed on the $SiO_2$ (T.O.) film by heating the device to diffuse $P_2O_5$ deposited in an atmosphere containing $POCl_3$ and $N_2$ and $O_2$ gases on the $SiO_2$(T.O.) film. In this step, the thickness of $SiO_2$ (T.O.) film becomes small. Preferably, the thickness of the $SiO_2$ (T.O.) film is from about 4,000 to about 15,000 A. The composite thickness of the first $SiO_2$ (T.O.) film and the phosphorous pentoxide film is about 6,000 to about 16,000 A. Then, the $P_2O_5$-$SiO_2$ film is coated by an $SiO_2$ (CVD) film 7. The composite thickness of the first $SiO_2$ film and the phosphorous glass film and the second $SiO_2$ film may range from about 7,000 to about 18,000 A. A part 8 corresponding to the opening is left as a concave depression as shown.

Next, the parts of the composite film corresponding to the opening and a groove for scribing the wafer are removed by a chemical etching method.

Figure 7C:
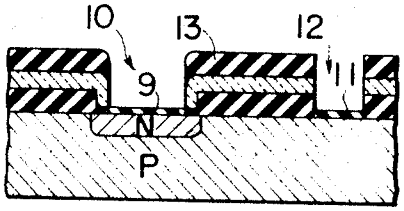

If an $Si_3N_4$ is in contact with the silicon body and it is removed by etching the surface of the body becomes rough. In order to avoid this problem, thin $SiO_2$ (T.O.) films 9 and 11 are formed on the exposed surfaces in opening 10 and 12 as shown in FIG. 7*c*, prior to forming the $Si_3N_4$ film.

Figure 7D:
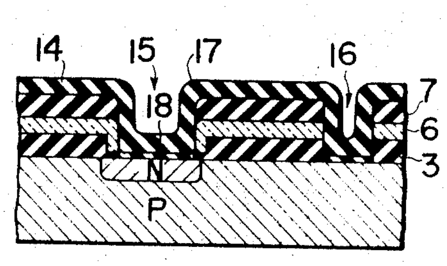
Figure 7E:
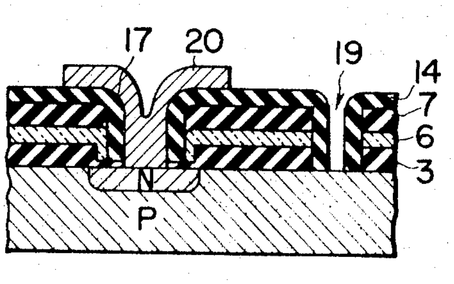

As shown in FIG. 7*d*, the surfaces of the $SiO_2$ (CVD) film 7 superposed on the $P_2O_5$-$SiO_2$ glass film, the thin $SiO_2$ (T.O.) films 9 and 11 and edges of the films are covered with an $Si_3N_4$ film 14 deposited from a gaseous atmosphere containing $NH_3$ and $SiH_4$. At the side part 17 of the $Si_3N_4$ film 14 no concentric stress generates even if the parts 17 and 18 are removed by chemical etching as shown in FIG. 7*e*. The opening 15 is filled with a metallic electrode 20 formed by vacuum evaporation. After the electrode 20 is formed, the wafer is scribed in accordance with the groove 19 to produce a desired semiconductor device having an improved composite passivating film.

While we have shown and described only one embodiment in accordance with the present invention, it is understood that the same is not limited thereto but is susceptible of numerous changes and modifications as known to those skilled in the art. For example, while the present invention has been described specifically with reference to a silicon wafer with a particular PN junction, the passivating film of the present invention is equally applicable to all other types of semiconductor devices requiring passivating films for similar reasons. Hence, we do not wish to be limited to the details shown and described herein but intend to cover all such changes and modifications as are encompassed by the scope of the appended claims.

What we claim is:

1. In a semiconductor device comprising a silicon body having at least one edge of a PN junction extending to a plane surface of said silicon body, a passivating film covering said plane surface including said edge surface so that said passivating film protects said device from undesirable irreversible change in electric parameters, and an electrode member electrically connected to said plane surface through an opening formed in said passivating film,the improvement wherein said passivating film comprises:

- a first silicon dioxide film covering said edge surface, formed by thermal oxidation of said silicon body and having a thickness of about 4,000 to 15,000 angstroms so that an increase in the surface change density at the edge surface is minimized;
- a phosphorous glass film having a concentration of $P_2O_5$ of about 5 to 9 mol percent for reducing the effect of alkali ions present in said first silicon dioxide film, formed on said first silicon dioxide film by thermal diffusion of phosphopentoxide and having a thickness of about 500 to 2,000 angstroms;
- a silicon nitride film for protecting said phosphorous glass film from moisture and having a thickess of about 1,000 to 3,000 angstroms; and
- a second silicon dioxide film for moderating the stress and preventing the chemical reaction occuring between said phosphorous glass film and silicon nitride film, interposed between said phosphorous glass film and said silicon nitride film and having a thickess of about 1,000 to 6,000 angstroms.

2. A semiconductor device according to claim 1, wherein the thickness of the first silicon doixide film and the phosphorous film is about 6,000 to about 16,000 angstroms.

3. A semiconductor device according to claim 1, wherein the thickness of the first silicon dioxide film, the phosphorous glass film and the second silicon dioxide film is about 7,000 to about 18,000 angstroms.

* * * * *